US010731045B2

(12) United States Patent
Sharma et al.

(10) Patent No.: US 10,731,045 B2
(45) Date of Patent: Aug. 4, 2020

(54) CURABLE INFRARED LIGHT ABSORBING PRINTING INK AND ARTICLES PREPARED WITH IT

(71) Applicant: 3M INNOVATIVE PROPERTIES COMPANY, St. Paul, MN (US)

(72) Inventors: Neeraj Sharma, Woodbury, MN (US); Eric J. Borchers, Lakeland, MN (US); Suman K. Patel, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 88 days.

(21) Appl. No.: 15/760,885

(22) PCT Filed: Sep. 21, 2016

(86) PCT No.: PCT/US2016/052847
§ 371 (c)(1),
(2) Date: Mar. 16, 2018

(87) PCT Pub. No.: WO2017/053401
PCT Pub. Date: Mar. 30, 2017

(65) Prior Publication Data
US 2018/0251647 A1 Sep. 6, 2018

Related U.S. Application Data

(60) Provisional application No. 62/232,881, filed on Sep. 25, 2015.

(51) Int. Cl.
*C09D 11/101* (2014.01)
*C09D 11/037* (2014.01)
(Continued)

(52) U.S. Cl.
CPC ........... *C09D 11/101* (2013.01); *B41M 3/006* (2013.01); *B41M 7/0081* (2013.01);
(Continued)

(58) Field of Classification Search
CPC ..... C09D 11/101; C09D 11/037; C09D 11/00; C09D 11/03
See application file for complete search history.

(56) References Cited

U.S. PATENT DOCUMENTS 2,736,721 A 2/1956 Dexter
3,437,622 A 4/1969 Dahl
(Continued)

FOREIGN PATENT DOCUMENTS

JP 2012-208169 10/2012
JP 2015-104865 6/2015
(Continued)

OTHER PUBLICATIONS

International Search Report for PCT International Application No. PCT/US2016/052847, dated Nov. 24, 2016, 5pgs.

*Primary Examiner* — Sanza L. McClendon
(74) *Attorney, Agent, or Firm* — Jeffrey M. Olofson

(57) ABSTRACT

Curable printing ink compositions include a visible light transparent, UV-curable binder composition and a visible light transparent, and infrared light absorbing inorganic composition. The infrared light absorbing inorganic composition can include infrared absorbing nanoparticles. The ink compositions are capable of flexographic printing at room temperature to a thickness of at least 1.0 micrometer. The cured ink composition has an infrared absorbance of at least 50%. The ink compositions can be printed in patterns of geometric features and cured to form articles.

19 Claims, 1 Drawing Sheet

(51) Int. Cl.
  *B41M 3/00* (2006.01)
  *B41M 7/00* (2006.01)
  *H05K 1/02* (2006.01)
  *H05K 1/09* (2006.01)
  *H05K 1/16* (2006.01)
  *H05K 3/12* (2006.01)

(52) U.S. Cl.
  CPC ......... *C09D 11/037* (2013.01); *H05K 1/0274* (2013.01); *H05K 1/095* (2013.01); *H05K 1/16* (2013.01); *H05K 3/1275* (2013.01); *H05K 3/1283* (2013.01); *B41P 2200/12* (2013.01); *H05K 2201/0108* (2013.01); *H05K 2201/2054* (2013.01)

(56) References Cited

U.S. PATENT DOCUMENTS

| | | |
|---|---|---|
| 3,718,712 A | 2/1973 | Tushaus |
| 3,841,890 A | 10/1974 | Coaker |
| 4,144,217 A | 3/1979 | Snelgrove |
| 5,209,971 A | 5/1993 | Babu |
| 5,214,119 A | 5/1993 | Leir |
| 5,591,820 A | 1/1997 | Kydonieus |
| 7,255,920 B2 | 8/2007 | Everaerts |
| 7,371,464 B2 | 5/2008 | Sherman |
| 7,981,995 B2 | 7/2011 | Hays |
| 8,007,578 B2* | 8/2011 | Bhatt ................ B41M 3/14 106/31.13 |
| 8,871,335 B2 | 10/2014 | Anderson |
| 8,901,225 B2* | 12/2014 | Okuda .................. G03F 7/037 524/431 |
| 2005/0080162 A1 | 4/2005 | Narayan-Sarathy |
| 2011/0123800 A1 | 5/2011 | Sherman |
| 2012/0092759 A1 | 4/2012 | Suzuki |
| 2012/0100326 A1 | 4/2012 | Sherman |
| 2014/0104689 A1 | 4/2014 | Padiyath |

FOREIGN PATENT DOCUMENTS

| | | |
|---|---|---|
| WO | WO 2000-75210 | 12/2000 |
| WO | WO 2016-073224 | 5/2016 |

\* cited by examiner

CURABLE INFRARED LIGHT ABSORBING PRINTING INK AND ARTICLES PREPARED WITH IT

FIELD OF THE DISCLOSURE

The present disclosure relates to printing inks, particularly UV-curable printing inks that are infrared light absorbing, and articles, especially electronic articles that are made with the printing inks.

BACKGROUND

The needs of the electronics industry has led to the development of "printed electronics". Printed electronics is a set of printing methods used to create electrical devices on various substrates. Printing typically uses common printing equipment suitable for defining patterns on material, such as screen printing, flexography, gravure, offset lithography, and inkjet. By electronic industry standards, these are low cost processes. Electrically functional electronic or optical inks are deposited on the substrate, creating active or passive devices, such as thin film transistors or resistors. Printed electronics are generally used to prepare very low-cost, low-performance electronics for applications such as flexible displays, smart labels, decorative and animated posters, and active clothing that do not require high performance.

The term printed electronics is often related to organic electronics or plastic electronics, in which one or more inks are composed of carbon-based compounds. These other terms refer to the ink material, which can be deposited by solution-based, vacuum-based or other processes. Printed electronics, in contrast, specifies the process, and, subject to the specific requirements of the printing process selected, can utilize any solution-based material. This includes organic semiconductors, inorganic semiconductors, metallic conductors, nanoparticles, nanotubes, etc.

For the preparation of printed electronics nearly all industrial printing methods are employed. Similar to conventional printing, printed electronics applies ink layers one atop another so that the coherent development of printing methods and ink materials are the field's essential tasks.

The attraction of printing technology for the fabrication of electronics mainly results from the possibility of preparing stacks of micro-structured layers (and thereby thin-film devices) in a much simpler and cost-effective way compared to conventional electronics. Also, the ability to implement new or improved functionalities (e.g. mechanical flexibility) plays a role. The selection of the printing method used is determined by requirements concerning printed layers, by the properties of printed materials as well as economic and technical considerations of the final printed products.

Printing technologies divide between sheet-based and roll-to-roll-based approaches. Sheet-based inkjet and screen printing are best for low-volume, high-precision work. Gravure, offset and flexographic printing are more common for high-volume production, such as solar cells, reaching 10,000 square meters per hour (m²/h). While offset and flexographic printing are mainly used for inorganic and organic conductors (the latter also for dielectrics), gravure printing is especially suitable for quality-sensitive layers like organic semiconductors and semiconductor/dielectric-interfaces in transistors, due to high layer quality.

While considerable advances have been made in printed optics and electronics, the need for new printing inks and printing techniques remains.

SUMMARY

Disclosed herein are ink compositions, methods of preparing articles with the ink compositions, and articles containing the ink compositions.

Among the embodiments disclosed herein are ink compositions comprising a visible light transparent, UV-curable binder composition and a visible light transparent, and infrared light absorbing inorganic composition. The ink compositions are capable of flexographic printing at room temperature to a thickness of at least 1.0 micrometer. The cured ink composition has an infrared absorbance of at least 50%.

Also disclosed are methods of preparing articles. In some embodiments, the method comprises providing a substrate with a first major surface and a second major surface, providing an ink composition as described above, where the ink composition comprises a visible light transparent, UV-curable binder composition, and a visible light transparent, and infrared light absorbing inorganic composition, flexographic printing the ink composition onto at least a portion of the second major surface of the substrate as a pattern of geometric features, and curing the UV-curable binder composition of the ink composition to form an array of geometric features on the second major surface of the substrate, where the ink composition after curing has an infrared absorbance of at least 50%.

Also disclosed are articles. In some embodiments, the articles comprise a substrate comprising a first major surface and a second major surface, and a non-repeating geometric pattern printed on at least a portion of the second major surface of the substrate, where the non-repeating geometric pattern comprises a series of geometric elements at least 1 micrometer in height, and where the geometric elements comprise a UV-cured ink composition. The ink composition comprises a visible light transparent, UV-curable binder composition, and a visible light transparent, and infrared light absorbing inorganic composition, as described above.

BRIEF DESCRIPTION OF THE DRAWINGS

The present application may be more completely understood in consideration of the following detailed description of various embodiments of the disclosure in connection with the accompanying drawings.

Figure 1:
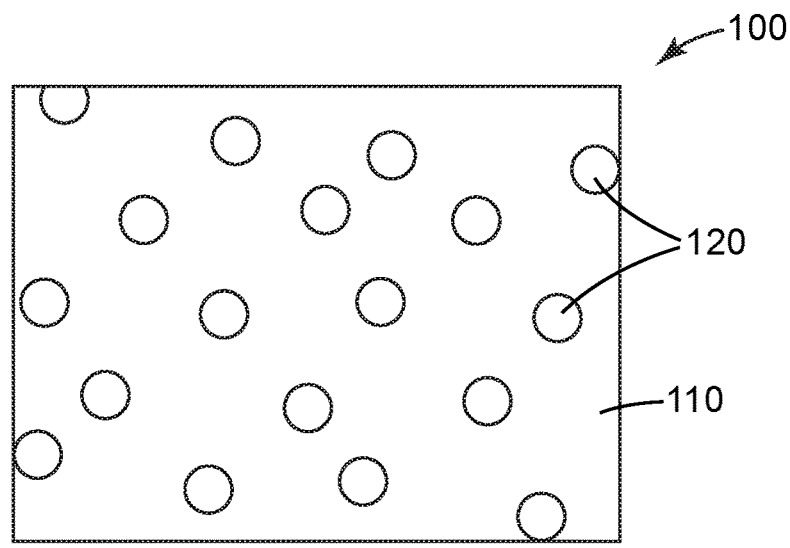
FIG. 1 shows a top view of an exemplary embodiment of an article of this disclosure.

In the following description of the illustrated embodiments, reference is made to the accompanying drawings, in which is shown by way of illustration, various embodiments in which the disclosure may be practiced. It is to be understood that the embodiments may be utilized and structural changes may be made without departing from the scope of the present disclosure. The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Advances in electronic devices have placed increasingly complex demands upon the materials and techniques used to prepare the electronic devices. Among the techniques used to prepare electronic components are printing techniques. The techniques use a variety of printing ink materials. These inks are materials that are delivered as fluids and then solidify after printing. Typically the delivery of materials by printing occurs in one of the following ways: a solid is delivered dissolved or suspended in a solvent or other liquid media and dried to form the printed image; a solid is heated and delivered at an elevated temperature and allowed to cool and solidify to form the printed image; or a curable material is delivered either as a 100% solids mixture or in a solvent or other liquid media and cured and if necessary dried. Each of these techniques has advantages and disadvantages.

When used in electronic devices, printing inks typically not only have to be delivered in patterns but also are being called upon to carry out other functions such as electrical connections and optical effects. Among the optical effects needs of electronic devices are printed patterns that are selective in their transmission of various wavelengths of light. For example, a variety of optically clear printing inks have been developed which permit visible light to be transmitted through the printed image.

One need that has arisen with electronic devices is the need to print patterns of geometric features which have small dimensions and are transparent to visible light but absorb infrared light. Additionally, as these patterns are present in electronic devices, they also must be stable over time and to environmental conditions such as stable to exposure to UV radiation.

The achievement of such a combination of properties is difficult, first of all because of the compositional limitations inherent in the processes of printing. By this it is meant that in order to print a printable ink, the ink must fall within a certain suitable viscosity range to allow it to be printed. The finer the printing needs to be, that is to say the smaller the size of the geometric figures to be printed, the tighter the viscosity limits are.

Combined with the viscosity limits placed upon the printing ink, in order to achieve printed patterns that are transparent to visible light but absorb infrared light requires the use of complex compositions that have this combination of visible light transparency and infrared light absorption. One technique for achieving infrared absorption is to add solid infrared absorption agents. However, the addition of such solid agents to a printing ink can prevent the ink from being printable. One technique that is useful in conventional coating techniques of complex compositions such as ones that contain solid infrared absorption agents is to dilute the compositions to a suitable coating viscosity. This cannot be done with compositions that are printed into patterns with small dimensions. For example, if one wishes to print square elements of a small size and prints a 5% solids ink (that is to say 95 parts by weight solvent and 5 parts by weight of non-solvent solid content that remains behind after drying) when dried, the coating loses 95% of its mass and only 5% of the material printed is left to cover area of the square element. Since the solid content of the ink is not just the solid infrared agent, but is the solid infrared agent together with a binding agent to hold the solid infrared agent in place, the solid infrared agent content of the printed element is thus very small. However, in order to effectively absorb infrared light, a certain quantity of solid infrared agent must be present in the printed element. Thus, dilution of the solids content of the printing ink to make the ink printable must be balanced with the need for the printed element to have sufficient solid content to function as desired (in this case to absorb infrared light).

Disclosed herein are printing inks that contain a visible and infrared light transparent UV-curable binder composition; and a visible light transparent, and infrared light absorbing inorganic composition, such that the ink composition is capable of flexographic printing at room temperature to a thickness of at least 1.0 micrometer. Also disclosed herein are methods of printing these printing inks and articles prepared using these printing inks. An advantage of the methods of this disclosure is that the printed elements with a thickness of at least 1.0 micrometers can be formed in a single printing pass, without the need for multiple printing passes to build the height of the printed elements. This is not only more convenient, it is also much more economical since it doesn't require repeated printing steps.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. For example, reference to "a layer" encompasses embodiments having one, two or more layers. As used in this specification and the appended claims, the term "or" is generally employed in its sense including "and/or" unless the content clearly dictates otherwise.

The term "room temperature" refers to ambient temperature, generally 20-22° C., unless otherwise noted.

The term "adhesive" as used herein refers to polymeric compositions useful to adhere together two adherends. Examples of adhesives are heat activated adhesives, and pressure sensitive adhesives.

Heat activated adhesives are non-tacky at room temperature but become tacky and capable of bonding to a substrate at elevated temperatures. These adhesives usually have a glass transition temperature ($T_g$) or melting point ($T_m$) above room temperature. When the temperature is elevated above the $T_g$ or $T_m$, the storage modulus usually decreases and the adhesive become tacky.

Pressure sensitive adhesive compositions are well known to those of ordinary skill in the art to possess at room temperature properties including the following: (1) aggressive and permanent tack, (2) adherence with no more than finger pressure, (3) sufficient ability to hold onto an adherend, and (4) sufficient cohesive strength to be cleanly removable from the adherend. Materials that have been found to function well as pressure sensitive adhesives are polymers designed and formulated to exhibit the requisite viscoelastic properties resulting in a desired balance of tack, peel adhesion, and shear holding power. Obtaining the proper balance of properties is not a simple process.

The term "free radically polymerizable" as used herein refers to materials that contain groups that participate in free radical polymerization reactions. Examples of free radically polymerizable groups are ethylenically unsaturated groups, such as vinyl groups and (meth)acrylate groups.

The term "(meth)acrylate" encompasses both acrylates and methacrylates. Acrylates are the esters of acrylic acid, methacrylates are the esters of methacrylic acid.

Unless otherwise indicated, "optically transparent" refers to an article, film or adhesive composition that has a light transmittance of at least 80% over at least a portion of the visible light spectrum (about 400 to about 700 nm).

The term "visible light" as used herein encompasses the wavelengths of the light spectrum that constitutes visible light (about 400 to about 700 nm).

The term "infrared light" as used herein encompasses the wavelengths of the light spectrum that constitutes infrared light (generally about 700 to 1500 nm).

The term "UV-curable composition" as used herein, refers to free radically polymerizable compositions that polymerize or "cure" upon exposure to UV light (ultraviolet light in the wavelength range of about 100 to 400 nm). Typically UV-curable compositions contain one or more free radically polymerizable monomers and one or more photoinitiators that activate in the UV wavelength region. Photoinitiators generate free radicals upon the absorption of light of the appropriate wavelength.

The term "capable of flexographic printing at room temperature" refers to ink compositions that have compositional characteristics making it possible to flexographically print the composition at room temperature, but does not mean that the composition has to be flexographically printed. The term is a compositional description not a process description. Just as the term, "a hammer with a surface capable of pounding a nail" is a compositional description of the hardness and smoothness of the surface of the hammer and does not mean that the hammer is limiting to the pounding of nails. Similarly, a composition that is capable of flexographic printing at room temperature at room temperature, does not mean that the composition is limited to flexographic printing, but rather that it has the compositional characteristics making it suitable for room temperature flexographic printing. The compositions that are described as capable of flexographic printing at room temperature may be printed by screen printing or ink jet printing for example.

The terms "Tg" and "glass transition temperature" are used interchangeably. If measured, Tg values are determined by Differential Scanning Calorimetry (DSC) at a scan rate of 10° C./minute, unless otherwise indicated. Typically, Tg values for copolymers are not measured but are calculated using the well-known Fox Equation, using the monomer Tg values provided by the monomer supplier, as is understood by one of skill in the art As used herein, the term "release liner", used interchangeably with the term "liner", refers to a thin flexible sheet which after being placed in intimate contact with an adhesive surface may be subsequently removed without damaging the adhesive coating.

As used herein, the term "structured liner" refers to a liner with a structured surface, and the term "microstructured liner" refers to a liner with a microstructured surface.

Disclosed herein are ink compositions with a variety of desirable, and often contradictory properties. The inks are capable of flexographic printing at room temperature to form a geometric feature with a height of at least 1 micrometer. The ink composition comprises a visible light transparent UV-curable binder composition, and a visible light transparent, and infrared light absorbing inorganic composition. The ink composition, after curing, has an infrared absorbance of at least 50%. By this it is meant that at least 50% of the infrared light, or light from a portion of the infrared wavelengths of the light spectrum, is not reflected from or transmitted through the cured ink composition. This infrared light absorbance can be measured using conventional techniques. In some embodiments, the infrared absorbance of the cured ink composition is at least 55%, at least 60%, at least 70%, or at least 75%.

The ink composition has a viscosity suitable to printing by flexographic printing at room temperature. In some embodiments, the ink composition has a viscosity in the range of 400-15,000 centiPoise. In some embodiments, the viscosity is in the range of 400-10,000 centiPoise. Typically the viscosity is measured using a Brookfield viscometer at room temperature using techniques well known to one of skill in the art.

The ink composition includes a UV-curable binder composition that is transparent to visible light. A wide variety of UV-curable binder compositions are suitable. In some embodiments, the UV-curable binder composition is a (meth)acrylate-based composition. In some embodiments, the UV-curable binder composition comprises a (meth)acrylate-based composition comprising at least one tri-functional (meth)acrylate, at least one di-functional (meth)acrylate, or a combination thereof, and at least one UV-activatable initiator. Examples of suitable tri-functional and di-functional (meth)acrylates include, tripropylene glycol diacrylate, trimethylolpropane diacrylate, trimethylolpropane diacrylate, bisphenol A epoxydiacrylate, neopentyl glycol diacrylate. The (meth)acrylate-based composition may also include mono-functional (meth)acrylates such as isobornyl methacrylate, or higher functional acrylates such as trimethylolpropane dimer tetraacrylate, and dipentaerthritol pentaacrylate.

A wide variety of UV-activatable initiators are suitable. Typically the UV-activatable initiators are called photoinitiators, meaning that the initiator is activated by light, in this case ultraviolet (UV) light. Examples of suitable free radical photoinitiators include DAROCURE 4265, IRGACURE 651, IRGACURE 1173, IRGACURE 819, LUCIRIN TPO, LUCIRIN TPO-L, commercially available from BASF, Charlotte, N.C. Generally the photoinitiator is used in amounts of 0.01 to 1 parts by weight, more typically 0.1 to 0.5, parts by weight relative to 100 parts by weight of total free radically polymerizable components present in the composition.

A number of printable commercially available UV-curable compositions are suitable as the UV-curable binder compositions. Examples include the clear ink "UV FLEXO IMPRINT NSV OPV" commercially available from Seigwerk Environmental Inks, Des Moines, Iowa; and high gloss ink "NAZDAR OP SERIES UV OP 1028 PREMIUM GLOSS I-IS OPV" commercially available from Nazdar Inks, USA.

A wide variety of visible light transparent, and infrared light absorbing inorganic compositions are suitable. Typically, the visible light transparent, and infrared light absorbing inorganic composition comprises nanoparticles of mixed metal oxides. In some embodiments, the visible light transparent, and infrared light absorbing inorganic composition comprises nanoparticles of tungsten oxide, doped tungsten oxides, or mixed metal tungsten oxides. In some specific embodiments, the visible light transparent, and infrared light absorbing inorganic composition comprises nanoparticles of cesium tungsten oxide. An example of a commercially available cesium tungsten oxide is the methylisobutylketone/4-methyl-2-pentanone dispersion commercially available from Sumitomo Metal and Mining Company as "YMF-02A".

In some embodiments, the ink is a 100% solids composition, meaning that there is no solvent or essentially no solvent present. The ink composition may contain liquid components, such as the reactive components of the UV-curable binder composition, but all, or essentially all, of the components that are printed to form an image element remain after curing.

Typically the ink composition comprises the visible light transparent, and infrared light absorbing inorganic composition in amount sufficient to give the desired infrared light absorbance, however, the visible light transparent, and infrared light absorbing inorganic composition cannot be at such a high level that the ink composition is no longer capable of being flexographically printed. In some embodiments, the visible light transparent, and infrared light absorbing inorganic composition is present in a range of from 10.0-35.0% by weight of the total solids of the ink composition.

The ink composition is capable of flexographic printing at room temperature to form a geometric feature with a height of at least 1 micrometer. As with the above described features, a variety of factors such as viscosity, loading levels of the visible light transparent and infrared light absorbing inorganic composition, and other compositional parameters are balanced so as to achieve this height feature. In some embodiments, the geometric feature height is in the range of 1 micrometer to 5 micrometers.

Typically, the printed geometric features are of relatively small average size. One of advantages of printing techniques is the ability to form relatively small and well defined geometric features. The geometric features can have a wide range of shapes both regular shapes and irregular shapes. In some embodiments, the perimeter of the geometric features are circular in shape, and the geometric features are typically described as "dots". In other embodiments, the geometric features may be linear, oblong, star-shaped, or a variety of other shapes. In some embodiments, the geometric features have an average diameter of from 50-200 micrometers. If the geometric features do not have a geometrically defined diameter, for the purposes of this disclosure, the diameter is taken to be the diameter of the largest circle that can completely encompass the geometric feature.

Also disclosed are methods for preparing articles using the ink compositions described above. In some embodiments, the method comprises providing a substrate with a first major surface and a second major surface, providing an ink composition as described above, flexographic printing the ink composition onto at least a portion of the second major surface of the substrate as a pattern of geometric features, and curing the UV-curable binder composition of the ink composition to form an array of geometric features on the second major surface of the substrate, wherein the ink composition after curing has an infrared absorbance of at least 50%. The ink composition, as described above, comprises a visible light transparent UV-curable binder composition, and a visible light transparent, and infrared light absorbing inorganic composition.

A wide range of substrates are suitable for the ink compositions to be printed upon. In some embodiments, the substrate comprises a film substrate, in other embodiments, the substrate comprises a rigid or semi-rigid substrate, in still other embodiments the substrate comprises the surface of an article such as an electronic device.

Substrates with a wide range of optical properties can be used. For example, in some embodiments, the substrate may be transparent to visible and infrared light. In other embodiments, the substrate may be opaque to visible and infrared light. In some desirable embodiments, the substrate is white in color and is therefore highly reflective of infrared light.

Examples of suitable substrates include a wide range of films including films prepared from: polyester materials such as PET (polyethylene terephthalate); polyolefin materials such as polyethylene, polypropylene, and the like, and blends and mixtures thereof; polyurethanes; polycarbonate; poly(meth)acrylates; PVC (polyvinyl chloride); EVA (ethylene vinyl acetate); and blends and mixtures thereof. Examples of rigid and semi-rigid substrates include glass, plastics, metals including metal oxides, and the like. Examples of substrates that are the surface of an article include surfaces of articles such as display screens, windows, graphic articles, signs, and the like.

In many embodiments the substrate is a film. The film may be a unitary construction or may be a multi-layer construction. Examples of multi-layer constructions include multi-layer films that can contain a variety of film layers and/or adhesive layers to adhere the layers together. Additionally, the film may have a variety of coatings or treatments applied to the surface. The coatings or treatments can be used to provide an optical effect to the substrate surface such as to color the substrate surface, or to change the surface energy or surface chemistry of the substrate, such as making the surface more receptive to the application of the ink composition. Additionally, the surface of the substrate may be flat or it may have a variety of surface topographies. Examples of surface topographies include relatively random topographies such as roughness or engineered topographies such as structured surface topographies, either on a micro-scale or macro-scale.

The second major surface of the substrate is printed with the ink composition as a pattern of geometric features. This printing can be carried out in a variety of ways, with flexographic printing being a particularly desirable method of printing.

Flexographic printing is a method of contact printing, and is well known and understood by one of skill in the art. A flexographic printing apparatus typically includes a flexographic printing plate which may be mounted e.g. onto the exterior surface of a printing cylinder (or which, in some embodiments, may itself be supplied in cylindrical form). An Anilox roll may be provided which may receive a liquid into cells of the exterior surface of the Anilox roll. Movement (e.g., rotation) of Anilox roll and printing cylinder causes the liquid to be transferred (in a metered amount) from cells of the Anilox roll, onto printing surfaces of the flexographic printing plate. Continued movement (e.g., rotation) of printing cylinder causes the liquid to be transferred from printing surfaces of the flexographic printing plate, onto the second major surface of the substrate.

In some embodiments, the flexographic printing plate may be processed as a flat plate to impart it with a desired printing pattern, and then curved and fitted onto the exterior surface of printing cylinder if desired. In some embodiments, the flexographic printing plate may be provided in cylindrical form rather than as a flat plate that may be eventually wrapped around a printing cylinder. In other general types of embodiments, the flexographic printing plate may be provided by molding a flexographic plate precursor material against a master mold whose surface contains a relief pattern that is complementary to the relief pattern that is desired to be provided in plate material. The molding process will thus produce a flexographic plate material with the desired relief structure. Such a plate precursor material may be any suitable flowable (moldable) material, whether thermoplastic, thermoset, and so on, as will be well understood by the ordinary artisan. In a variation of such approaches, an embossable plate precursor material may be used, which, while it may not necessarily approach such low viscosity as e.g. a moldable material, nevertheless will soften sufficiently upon being heated to allow the desired relief pattern to be formed therein, which pattern is maintained upon cooling of the embossable plate precursor material. Additional information about flexographic printing is provided in the Examples section below.

The ink composition is printed as a pattern of geometric features. The features have a height above the substrate surface of at least 1 micrometer. In some embodiments, the geometric feature height is in the range of 1 micrometer to 5 micrometers. Such heights are desirable to give cured geometric features with the desired infrared absorption properties. In order to achieve these geometric feature heights, the ink composition has to have an array of suitable properties including a coatable viscosity and the ability to wet out the flexographic printing plate. These properties are described above.

Typically, the printed geometric features are of relatively small average size. One of advantages of printing techniques is the ability to form relatively small and well defined geometric features. The geometric features can have a wide range of shapes both regular shapes and irregular shapes. In some embodiments, the perimeter of the geometric features are circular in shape, and the geometric features are typically described as "dots". In other embodiments, the geometric features may be linear, oblong, star-shaped, or a variety of other shapes. In some embodiments, the geometric features have an average diameter of from 50-200 micrometers. If the geometric features do not have a geometrically defined diameter, for the purposes of this disclosure, the diameter is taken to be the diameter of the largest circle that can completely encompass the geometric feature.

In some embodiments, the pattern of geometric features comprises a random or non-random pattern of dots, or a series of parallel or intersecting lines. Random patterns of dots are particularly suitable, especially non-repeating patterns of dots. An example of a non-repeating pattern of dots is the Anoto system from Anoto. In the Anoto system, every dot on an Anoto page is one of four positions: up, down, left or right. A reading device that can locate the dots is capable of determining its absolute position from a 6×6 grid of these dots. Thus if one looks at six dots in a row from the sequence, one knows where one is in the sequence.

Typically, the pattern of geometric features is printed in such a way that the printed ink covers only a small portion of the surface. In this way, a majority of the second major surface of the printed substrate does not contain the printed ink. Another way of stating this is that the portion of the surface of the second major surface of the substrate to which the ink composition is printed comprises a surface area, and the array of geometric features cover 5-20% of the surface area of the second major surface of the substrate. If ink is applied to the entire second major surface of substrate, the entire second major surface comprises the surface area. If, however, print is applied only to a portion of the second major surface, that portion comprises the surface area.

The printed ink composition is then cured to cure the UV-curable binder composition. If solvent is included in the ink composition, the printed ink composition can also be dried, either prior to curing or simultaneously. Typically, no solvent is used so that drying is not necessary. Typically the ink includes a photoinitiator, which produces free radicals upon activation by UV light, initiating the polymerization of the free radically polymerizable materials in the UV-curable binder composition. UV light is typically provided by exposing the curable ink composition to a lamp that generates UV light such as a mercury arc lamp, a black light or other UV lamps.

Also disclosed herein are articles. These articles comprise a substrate comprising a first major surface and a second major surface, and a non-repeating geometric pattern printed on at least a portion of the second major surface of the substrate, wherein the non-repeating geometric pattern comprises a series of geometric elements at least 1 micrometer in height. The geometric elements comprise the UV-cured ink composition described above.

A wide range of substrates are suitable for the ink compositions to be printed upon. In some embodiments, the substrate comprises a film substrate, in other embodiments, the substrate comprises a rigid or semi-rigid substrate, in still other embodiments the substrate comprises the surface of an article such as an electronic device.

Substrates with a wide range of optical properties can be used. For example, in some embodiments, the substrate may be transparent to visible and infrared light. In other embodiments, the substrate may be opaque to visible and infrared light. In some desirable embodiments, the substrate is white in color and is therefore highly reflective of infrared light.

Examples of suitable substrates include a wide range of films including films prepared from: polyester materials such as PET (polyethylene terephthalate); polyolefin materials such as polyethylene, polypropylene, and the like, and blends and mixtures thereof; polyurethanes; polycarbonate; poly(meth)acrylates; PVC (polyvinyl chloride); EVA (ethylene vinyl acetate); and blends and mixtures thereof. Examples of rigid and semi-rigid substrates include glass, plastics, metals including metal oxides, and the like. Examples of substrates that are the surface of an article include surfaces of articles such as display screens, windows, graphic articles, signs, and the like.

In many embodiments the substrate is a film. The film may be a unitary construction or may be a multi-layer construction. Examples of multi-layer constructions include multi-layer films that can contain a variety of film layers and/or adhesive layers to adhere the layers together. Additionally, the film may have a variety of coatings or treatments applied to the surface. The coatings or treatments can be used to provide an optical effect to the substrate surface such as to color the substrate surface, or to change the surface energy or surface chemistry of the substrate, such as making the surface more receptive to the application of the ink composition.

The geometric features comprising a cured ink composition have a height above the substrate surface of at least 1 micrometer. In some embodiments, the geometric feature height is in the range of 1 micrometer to 5 micrometers. Such heights are desirable to give the desired infrared absorption properties. For example, if the geometric features are printed onto an infrared light reflecting substrate, it is desirable for the infrared absorbing geometric features to absorb sufficient infrared light such that there is a contrast between the unprinted portions which reflect the infrared light and the printed portions which absorb the infrared light. In this way a device that measures the infrared light reflected from the substrate surface will be able to detect which portions of the surface are the printed portions by the noticeable difference in the amount of reflected infrared light.

Typically, the geometric features are of relatively small average size. The geometric features can have a wide range of shapes both regular shapes and irregular shapes. In some embodiments, the perimeter of the geometric features are circular in shape, and the geometric features are typically described as "dots". In other embodiments, the geometric features may be linear, oblong, star-shaped, or a variety of other shapes. In some embodiments, the geometric features have an average diameter of from 50-200 micrometers. If the geometric features do not have a geometrically defined diameter, for the purposes of this disclosure, the diameter is taken to be the diameter of the largest circle that can completely encompass the geometric feature.

In some embodiments, the pattern of geometric features comprises a random or non-random pattern of dots, or a series of parallel or intersecting lines. Random patterns of dots are particularly suitable, especially non-repeating patterns of dots. An example of a non-repeating pattern of dots is the Anoto system from Anoto. In the Anoto system, every dot on an Anoto page is one of four positions: up, down, left or right. A reading device that can locate the dots is capable of determining its absolute position from a 6×6 grid of these dots. Thus if one looks at six dots in a row from the sequence, one knows where one is in the sequence.

Typically, the pattern of geometric features is printed in such a way that the cured ink geometric features cover only a small portion of the surface. In this way, a majority of the second major surface of the printed substrate does not contain the printed ink. Another way of stating this is that the portion of the surface of the second major surface of the substrate to which the cured ink composition is present comprises a surface area, and the array of geometric features cover 5-20% of the surface area of the second major surface of the substrate. If ink is applied to the entire second major surface of substrate, the entire second major surface comprises the surface area. If, however, print is applied only to a portion of the second major surface, that portion comprises the surface area.

The articles can include a vast array of additional layers and coatings. In some embodiments, the article further comprises a coating at least partially covering the non-repeating geometric pattern comprising a series of geometric elements. In some embodiments this coating comprises a hardcoat. A hardcoat is a relatively thin and hard coating that is applied to protect a surface. Typically, hardcoats are transparent to visible light. In some embodiments of this disclosure, the hardcoat further comprises an infrared absorbing composition. This infrared absorbing composition may be the same or different from the infrared absorbing composition in the ink composition. Generally, if an infrared absorbing composition is included in the hardcoat, the level of infrared absorbing composition present in the coating is significantly less than the level of infrared absorbing composition present in the ink composition. The exposed surface of the coating, whether a hardcoat or a non-hardcoat, can have a variety of surface features such as surface topographic features, printed features, and the like. In some embodiments, additional layers and coatings may cover the coating. Additionally, the coating may comprise a film or other layer that may be thicker than a traditional coating layer such as a hardcoat.

The articles of this disclosure can be used as part of a larger construction. Often when the article is to be used as part of a larger construction, the article further comprises an adhesive layer at least partially covering the first major surface of the substrate. This adhesive layer can be used to attach the article to a variety of substrates, or to the surface of an article. The adhesive can be a pressure sensitive adhesive or a heat activated adhesive. To protect the adhesive layer, such as a release liner, may cover the adhesive layer. Upon use the release liner can be removed to expose the adhesive layer.

A wide range of adhesive layers are suitable to be disposed upon the first major surface of the substrate. Particularly suitable adhesives are heat activated adhesives and pressure sensitive adhesives. In many embodiments, it is desirable that the adhesive be optically transparent or optically clear.

A wide variety of optically clear heat activated adhesives may be used. Examples of suitable optically clear heat activated adhesives include polyacrylate hot melt adhesives, polyvinyl butyrals, ethylene vinyl acetate, ionomers, polyolefins, or combinations thereof.

The optically clear heat activated adhesives may be (meth)acrylate-based hot melt adhesives. The hot melt adhesives typically are prepared from (meth)acrylate polymers that have a glass transition temperature (Tg) of greater than room temperature, more typically greater than about 40° C., and are prepared from alkyl (meth)acrylate monomers. Useful alkyl (meth)acrylates (i.e., acrylic acid alkyl ester monomers) include linear or branched monofunctional unsaturated acrylates or methacrylates of non-tertiary alkyl alcohols, the alkyl groups of which have from 4 to 14 and, in particular, from 4 to 12 carbon atoms. Poly(meth)acrylic hot melt adhesives may also contain optional co-monomer components such as, for example, (meth)acrylic acid, vinyl acetate, N-vinyl pyrrolidone, (meth)acrylamide, a vinyl ester, a fumarate, a styrene macromer, alkyl maleates and alkyl fumarates (based, respectively, on maleic and fumaric acid), or combinations thereof.

In some embodiments, the adhesive layer is at least partially formed of polyvinyl butyral. The polyvinyl butyral layer may be formed via known aqueous or solvent-based acetalization process in which polyvinyl alcohol is reacted with butyraldehyde in the presence of an acidic catalyst. In some instances, the polyvinyl butyral layer may include or be formed from polyvinyl butyral that is commercially available from Solutia Incorporated, of St. Louis, Mo., under the trade name "BUTVAR" resin.

In some instances, the polyvinyl butyral layer may be produced by mixing resin and (optionally) plasticizer and extruding the mixed formulation through a sheet die. If a plasticizer is included, the polyvinyl butyral resin may include about 20 to 80 or perhaps about 25 to 60 parts of plasticizer per hundred parts of resin. Examples of suitable plasticizers include esters of a polybasic acid or a polyhydric alcohol. Suitable plasticizers are triethylene glycol bis(2-ethylbutyrate), triethylene glycol di-(2-ethylhexanoate), triethylene glycol diheptanoate, tetraethylene glycol diheptanoate, dihexyl adipate, dioctyl adipate, hexyl cyclohexyl adipate, mixtures of heptyl and nonyl adipates, diisononyl adipate, heptylnonyl adipate, dibutyl sebacate, polymeric plasticizers such as the oil-modified sebacic alkyds, and mixtures of phosphates and adipates such as disclosed in U.S. Pat. No. 3,841,890 and adipates such as disclosed in U.S. Pat. No. 4,144,217.

Examples of suitable ethylene vinyl acetate (EVA) adhesives include a wide range of commercially available EVA hot melt adhesives. Typically these EVA hot melt adhesives have a vinyl acetate content of from about 18-29% by weight of the polymer. The adhesives typically have high amounts of tackifiers and waxes. An exemplary composition is one with 30-40% by weight of EVA polymer, 30-40% by weight of tackifier, 20-30% by weight of wax, and 0.5-1% by weight of stabilizers. Examples of suitable EVA hot melt adhesives are the BYNEL SERIES 3800 resins commercially available from DuPont, Wilmington, Del. (including BYNEL 3810, BYNEL 3859, BYNEL 3860, and BYNEL 3861). A particularly suitable EVA hot melt adhesive is the material available from Bridgestone Corp. Tokyo, JP under the trade name "EVASAFE".

Examples of suitable ionomeric adhesives are the "ionoplast resins". Ionoplast resins are copolymers of ethylene and unsaturated carboxylic acids, wherein at least a portion of the acid groups in the copolymer have been neutralized to the salt form of the acid. Extruded sheets of ionoplast resins suitable for use in this disclosure are commercially available from DuPont Chemicals, Wilmington, Del., under the trade name "SENTRYGLASS PLUS".

Examples of suitable polyolefin adhesives include ethylene/α-olefin copolymers. As used herein, the term "ethylene/α-olefin copolymer" refers to polymers comprising a class of hydrocarbons manufactured by the catalytic oligomerization (i.e., polymerization to low-molecular-weight products) of ethylene and linear α-olefin monomers. The ethylene/α-olefin copolymers may be made, for example, with a single site catalyst such as a metallocene catalyst or multi-site catalysts such as Ziegler-Natta and Phillips catalysts. The linear α-olefin monomers typically are 1-butene or 1-octene but may range from C3 to C20 linear, branched or cyclic α-olefin. The α-olefin may be branched but only if the branch is at least alpha to the double bond, such as 3-methyl-1-pentene. Examples of C3-C20 α-olefins include propylene, 1-butene, 4-methyl-1-butene, 1-hexene, 1-octene, 1-dodecene, 1-tetradecene, 1-hexadecene and 1-octadecene. The α-olefins can also contain a cyclic structure such as cyclohexane or cyclopentane, resulting in an α-olefin such as 3-cyclohexyl-1 propene (allyl cyclohexane) and vinyl cyclohexane. Although not α-olefins in the classical sense of the term, for purposes of this disclosure certain cyclic olefins, such as norbornene and related olefins, are α-olefins and can be used. Similarly, styrene and its related olefins (for example, α-methyl styrene) are α-olefins for the purposes of this disclosure. Acrylic and methacrylic acid and their respective ionomers, and acrylates and methacrylates, however are not α-olefins for the purposes of this disclosure. Illustrative ethylene/α-olefin copolymers include ethylene/1-butene, ethylene/1-octene, ethylene/1-butene/1-octene, ethylene/styrene. The polymers can be block or random. Exemplary commercially available low crystalline ethylene/α-olefin copolymers include resins sold under the tradenames "ENGAGE" ethylene/1-butene and ethylene/1-octene copolymers and "FLEXOMER" ethylene/1-hexene copolymer, available from Dow Chemical Co., and homogeneously branched, substantially linear ethylene/α-olefin copolymers such as "TAFMER", available from Mitsui Petrochemicals Company Limited, and "EXACT", available from ExxonMobil Corp. As used herein, the term "copolymer" refers to polymers made from at least 2 monomers.

In some of these embodiments, the α-olefin moiety of the ethylene/α-olefin copolymer includes four or more carbons. In some embodiments, the ethylene/α-olefin copolymer is a low crystalline ethylene/α-olefin copolymer. As used herein, the term "low crystalline" means crystallinity (according to method disclosed in ASTM F2625-07) of less than 50% by weight. In some embodiments, the low crystalline ethylene/α-olefin copolymer is a butene α-olefin. In some embodiments the α-olefin of the low crystalline ethylene/α-olefin copolymer has 4 or more carbons.

In some embodiments, the low crystalline ethylene/α-olefin copolymer has a DSC peak melting point of less than or equal to 50° C. As used herein, the term "DSC peak melting point" means a melting point determined by DSC (10°/min) under nitrogen purge as the peak with the largest area under the DSC curve.

Suitable pressure sensitive adhesives include those based on natural rubbers, synthetic rubbers, styrene block copolymers, polyvinyl ethers, (meth)acrylates, poly-α-olefins, silicones, urethanes or ureas. As with the heat activated adhesives described above, typically the pressure sensitive adhesive is optically transparent or optically clear.

Useful natural rubber pressure sensitive adhesives generally contain masticated natural rubber, from 25 parts to 300 parts of one or more tackifying resins to 100 parts of natural rubber, and typically from 0.5 to 2.0 parts of one or more antioxidants. Natural rubber may range in grade from a light pale crepe grade to a darker ribbed smoked sheet and includes such examples as CV-60, a controlled viscosity rubber grade and SMR-5, a ribbed smoked sheet rubber grade.

Tackifying resins used with natural rubbers generally include but are not limited to wood rosin and its hydrogenated derivatives; terpene resins of various softening points, and petroleum-based resins, such as, the "ESCOREZ 1300" series of C5 aliphatic olefin-derived resins from Exxon, and "PICCOLYTE S" series, polyterpenes from Hercules, Inc. Antioxidants are used to retard the oxidative attack on natural rubber, which can result in loss of the cohesive strength of the natural rubber adhesive. Useful antioxidants include but are not limited to amines, such as N—N' di-ß-naphthyl-1,4-phenylenediamine, available as "AGERITE D"; phenolics, such as 2,5-di-(t-amyl) hydroquinone, available as "SANTOVAR A", available from Monsanto Chemical Co., tetrakis[methylene 3-(3',5'-di-tert-butyl-4'-hydroxyphenyl)propianate]methane, available as "IRGANOX 1010" from Ciba-Geigy Corp., and 2-2'-methylenebis(4-methyl-6-tert butyl phenol), available as Antioxidant 2246; and dithiocarbamates, such as zinc dithiodibutyl carbamate. Other materials can be added to natural rubber adhesives for special purposes, wherein the additions can include plasticizers, pigments, and curing agents to partially vulcanize the pressure sensitive adhesive.

Another useful class of pressure sensitive adhesives are those comprising synthetic rubber. Such adhesives are generally rubbery elastomers, which are either self-tacky or non tacky and require tackifiers.

Self-tacky synthetic rubber pressure sensitive adhesives include for example, butyl rubber, a copolymer of isobutylene with less than 3 percent isoprene, polyisobutylene, a homopolymer of isoprene, polybutadiene, such as "TAKTENE 220 BAYER" or styrene/butadiene rubber. Butyl rubber pressure sensitive adhesives often contain an antioxidant such as zinc dibutyl dithiocarbamate. Polyisobutylene pressure sensitive adhesives do not usually contain antioxidants. Synthetic rubber pressure sensitive adhesives, which generally require tackifiers, are also generally easier to melt process. They comprise polybutadiene or styrene/butadiene rubber, from 10 parts to 200 parts of a tackifier, and generally from 0.5 to 2.0 parts per 100 parts rubber of an antioxidant such as "IRGANOX 1010". An example of a synthetic rubber is "AMERIPOL 1011A", a styrene/butadiene rubber available from BF Goodrich. Tackifiers that are useful include derivatives of rosins such as "FORAL 85", a stabilized rosin ester from Hercules, Inc., the "SNOWTACK" series of gum rosins from Tenneco, and the "AQUATAC" series of tall oil rosins from Sylvachem; and synthetic hydrocarbon resins such as the "PICCOLYTE A" series, polyterpenes from Hercules, Inc., the "ESCOREZ 1300" series of $C_5$ aliphatic olefin-derived resins, the "ESCOREZ 2000" Series of $C_9$ aromatic/aliphatic olefin-derived resins, and polyaromatic $C_9$ resins, such as the "PICCO 5000" series of aromatic hydrocarbon resins, from Hercules, Inc. Other materials can be added for special purposes, including hydrogenated butyl rubber, pigments, plasticizers, liquid rubbers, such as "VISTANEX LMMH"

polyisobutylene liquid rubber available from Exxon, and curing agents to vulcanize the adhesive partially.

Styrene block copolymer pressure sensitive adhesives generally comprise elastomers of the A-B or A-B-A type, where A represents a thermoplastic polystyrene block and B represents a rubbery block of polyisoprene, polybutadiene, or poly(ethylene/butylene), and resins. Examples of the various block copolymers useful in block copolymer pressure sensitive adhesives include linear, radial, star and tapered styrene-isoprene block copolymers such as "KRATON D1107P", available from Shell Chemical Co., and "EUROPRENE SOL TE 9110", available from EniChem Elastomers Americas, Inc.; linear styrene-(ethylene-butylene) block copolymers such as "KRATON G1657", available from Shell Chemical Co.; linear styrene-(ethylene-propylene) block copolymers such as "KRATON G1750X", available from Shell Chemical Co.; and linear, radial, and star styrene-butadiene block copolymers such as "KRATON D1118X", available from Shell Chemical Co., and "EUROPRENE SOL TE 6205", available from EniChem Elastomers Americas, Inc. The polystyrene blocks tend to form domains in the shape of spheroids, cylinders, or plates that causes the block copolymer pressure sensitive adhesives to have two phase structures. Resins that associate with the rubber phase generally develop tack in the pressure sensitive adhesive. Examples of rubber phase associating resins include aliphatic olefin-derived resins, such as the "ESCOREZ 1300" series and the "WINGTACK" series, available from Goodyear; rosin esters, such as the "FORAL" series and the "STAYBELITE" Ester 10, both available from Hercules, Inc.; hydrogenated hydrocarbons, such as the "ESCOREZ 5000" series, available from Exxon; polyterpenes, such as the "PICCOLYTE A" series; and terpene phenolic resins derived from petroleum or terpentine sources, such as "PICCOFYN A100", available from Hercules, Inc. Resins that associate with the thermoplastic phase tend to stiffen the pressure sensitive adhesive. Thermoplastic phase associating resins include polyaromatics, such as the "PICCO 6000" series of aromatic hydrocarbon resins, available from Hercules, Inc.; coumarone-indene resins, such as the "CUMAR" series, available from Neville; and other high-solubility parameter resins derived from coal tar or petroleum and having softening points above about 85° C., such as the "AMOCO 18" series of alphamethyl styrene resins, available from Amoco, "PICCOVAR 130" alkyl aromatic polyindene resin, available from Hercules, Inc., and the "PICCOTEX" series of alphamethyl styrene/vinyl toluene resins, available from Hercules. Other materials can be added for special purposes, including rubber phase plasticizing hydrocarbon oils, such as, "TUFFLO 6056", available from Lydondell Petrochemical Co., Polybutene-8 from Chevron, "KAYDOL", available from Witco, and "SHELL-FLEX 371", available from Shell Chemical Co.; pigments; antioxidants, such as "IRGANOX 1010" and "IRGANOX 1076", both available from Ciba-Geigy Corp., "BUTAZATE", available from Uniroyal Chemical Co., "CYANOX LDTP", available from American Cyanamid, and "BUTASAN", available from Monsanto Co.; antiozonants, such as "NBC", a nickel dibutyldithiocarbamate, available from DuPont; liquid rubbers such as "VISTANEX LMMH" polyisobutylene rubber; and ultraviolet light inhibitors, such as "IRGANOX 1010" and "TINUVIN P", available from Ciba-Geigy Corp.

Polyvinyl ether pressure sensitive adhesives are generally blends of homopolymers of vinyl methyl ether, vinyl ethyl ether or vinyl iso-butyl ether, or blends of homopolymers of vinyl ethers and copolymers of vinyl ethers and acrylates to achieve desired pressure sensitive properties. Depending on the degree of polymerization, homopolymers may be viscous oils, tacky soft resins or rubber-like substances. Polyvinyl ethers used as raw materials in polyvinyl ether adhesives include polymers based on: vinyl methyl ether such as "LUTANOL M 40", available from BASF, and "GANTREZ M 574" and "GANTREZ 555", available from ISP Technologies, Inc.; vinyl ethyl ether such as "LUTANOL A 25", "LUTANOL A 50" and "LUTANOL A 100"; vinyl isobutyl ether such as "LUTANOL 130", "LUTANOL 160", "LUTANOL IC", "LUTANOL 160D" and "LUTANOL I 65D"; methacrylate/vinyl isobutyl ether/acrylic acid such as "ACRONAL 550 D", available from BASF. Antioxidants useful to stabilize the polyvinylether pressure sensitive adhesive include, for example, "IONOX 30" available from Shell, "IRGANOX 1010" available from Ciba-Geigy, and antioxidant "ZKF" available from Bayer Leverkusen. Other materials can be added for special purposes as described in BASF literature including tackifier, plasticizer and pigments.

(Meth)acrylate-based pressure sensitive adhesives generally have a glass transition temperature of about −20° C. or less and may comprise from 100 to 80 weight percent of a $C_3$-$C_{12}$ alkyl ester component such as, for example, isooctyl acrylate, 2-ethyl-hexyl acrylate and n-butyl acrylate and from 0 to 20 weight percent of a polar component such as, for example, acrylic acid, methacrylic acid, ethylene vinyl acetate, N-vinyl pyrrolidone and styrene macromer. Generally, the (meth)acrylate-based pressure sensitive adhesives comprise from 0 to 20 weight percent of acrylic acid and from 100 to 80 weight percent of isooctyl acrylate. The (meth)acrylate-based pressure sensitive adhesives may be self-tacky or tackified. Useful tackifiers for acrylics are rosin esters such as "FORAL 85", available from Hercules, Inc., aromatic resins such as "PICCOTEX LC-55WK", aliphatic resins such as "PICCOTAC 95", available from Hercules, Inc., and terpene resins such as α-pinene and ß-pinene, available as "PICCOLYTE A-115" and "ZONAREZ ß-100" from Arizona Chemical Co. Other materials can be added for special purposes, including hydrogenated butyl rubber, pigments, and curing agents to vulcanize the adhesive partially.

Poly-α-olefin pressure sensitive adhesives, also called a poly(1-alkene) pressure sensitive adhesives, generally comprise either a substantially uncrosslinked polymer or a uncrosslinked polymer that may have radiation activatable functional groups grafted thereon as described in U.S. Pat. No. 5,209,971 (Babu, et al) which is incorporated herein by reference. The poly-α-olefin polymer may be self tacky and/or include one or more tackifying materials. If uncrosslinked, the inherent viscosity of the polymer is generally between about 0.7 and 5.0 dL/g as measured by ASTM D 2857-93, "Standard Practice for Dilute Solution Viscosity of Polymers". In addition, the polymer generally is predominantly amorphous. Useful poly-α-olefin polymers include, for example, $C_3$-$C_{18}$ poly(1-alkene) polymers, generally $C_5$-$C_{12}$ α-olefins and copolymers of those with $C_3$ or $C_6$-$C_8$ and copolymers of those with $C_3$. Tackifying materials are typically resins that are miscible in the poly-α-olefin polymer. The total amount of tackifying resin in the poly-α-olefin polymer ranges between 0 to 150 parts by weight per 100 parts of the poly-α-olefin polymer depending on the specific application. Useful tackifying resins include resins derived by polymerization of $C_5$ to $C_9$ unsaturated hydrocarbon monomers, polyterpenes, synthetic polyterpenes and the like. Examples of such commercially available resins based on a $C_5$ olefin fraction of this type are "WINGTACK 95" and "WINGTACK 15" tackifying resins available from Goodyear Tire and Rubber Co. Other hydrocarbon resins include "REGALREZ 1078" and "REGALREZ 1126" available from Hercules Chemical Co., and "ARKON P115" available from Arakawa Chemical Co. Other materials can be added for special purposes, including antioxidants, fillers, pigments, and radiation activated crosslinking agents.

Silicone pressure sensitive adhesives comprise two major components, a polymer or gum, and a tackifying resin. The polymer is typically a high molecular weight polydimethylsiloxane or polydimethyldiphenylsiloxane, that contains residual silanol functionality (SiOH) on the ends of the polymer chain, or a block copolymer comprising polydiorganosiloxane soft segments and urea terminated hard segments. The tackifying resin is generally a three-dimensional silicate structure that is endcapped with trimethylsiloxy groups ($OSiMe_3$) and also contains some residual silanol functionality. Examples of tackifying resins include SR 545, from General Electric Co., Silicone Resins Division, Waterford, N.Y., and MQD-32-2 from Shin-Etsu Silicones of America, Inc., Torrance, Calif. Manufacture of typical silicone pressure sensitive adhesives is described in U.S. Pat. No. 2,736,721 (Dexter). Manufacture of silicone urea block copolymer pressure sensitive adhesive is described in U.S. Pat. No. 5,214,119 (Leir, et al). Other materials can be added for special purposes, including, pigments, plasticizers, and fillers. Fillers are typically used in amounts from 0 parts to 10 parts per 100 parts of silicone pressure sensitive adhesive. Examples of fillers that can be used include zinc oxide, silica, carbon black, pigments, metal powders and calcium carbonate. One suitable class of siloxane-containing pressure sensitive adhesives are those with oxamide terminated hard segments such as those described in U.S. Pat. No. 7,981,995 (Hays) and U.S. Pat. No. 7,371,464 (Sherman).

Useful polyurethane and polyurea pressure sensitive adhesives useful include, for example, those disclosed in WO 00/75210 (Kinning et al.) and in U.S. Pat. No. 3,718,712 (Tushaus); U.S. Pat. No. 3,437,622 (Dahl); and U.S. Pat. No. 5,591,820 (Kydonieus et al.). Additionally, the urea-based pressure sensitive adhesives described in US Patent Publication No. 2011/0123800 (Sherman et al.) and the urethane-based pressure sensitive adhesives described in US Patent Publication No. 2012/0100326 (Sherman et al.) may be suitable.

One particularly suitable class of optically clear pressure sensitive adhesives are (meth)acrylate-based pressure sensitive adhesives and may comprise either an acidic or basic copolymer. In many embodiments the (meth)acrylate-based pressure sensitive adhesive is an acidic copolymer. Generally, as the proportion of acidic monomers used in preparing the acidic copolymer increases, cohesive strength of the resulting adhesive increases. The proportion of acidic monomers is usually adjusted depending on the proportion of acidic copolymer present in the blends of the present disclosure.

To achieve pressure sensitive adhesive characteristics, the corresponding copolymer can be tailored to have a resultant glass transition temperature (Tg) of less than about 0° C. Particularly suitable pressure sensitive adhesive copolymers are (meth)acrylate copolymers. Such copolymers typically are derived from monomers comprising about 40% by weight to about 98% by weight, often at least 70% by weight, or at least 85% by weight, or even about 90% by weight, of at least one alkyl (meth)acrylate monomer that, as a homopolymer, has a Tg of less than about 0° C.

Examples of such alkyl (meth)acrylate monomers are those in which the alkyl groups comprise from about 4 carbon atoms to about 12 carbon atoms and include, but are not limited to, n-butyl acrylate, 2-ethylhexyl acrylate, isooctyl acrylate, isononyl acrylate, isodecyl acrylate, and mixtures thereof. Optionally, other vinyl monomers and alkyl (meth)acrylate monomers which, as homopolymers, have a Tg greater than 0° C., such as methyl acrylate, methyl methacrylate, isobornyl acrylate, vinyl acetate, styrene, and the like, may be utilized in conjunction with one or more of the low Tg alkyl (meth)acrylate monomers and copolymerizable basic or acidic monomers, provided that the Tg of the resultant (meth)acrylate copolymer is less than about 0° C.

In some embodiments, it is desirable to use (meth)acrylate monomers that are free of alkoxy groups. Alkoxy groups are understood by those skilled in the art.

When used, basic (meth)acrylate copolymers useful as the pressure sensitive adhesive matrix typically are derived from basic monomers comprising about 2% by weight to about 50% by weight, or about 5% by weight to about 30% by weight, of a copolymerizable basic monomer. Exemplary basic monomers include N,N-dimethylaminopropyl methacrylamide (DMAPMAm); N,N-diethylaminopropyl methacrylamide (DEAPMAm); N,N-dimethylaminoethyl acrylate (DMAEA); N,N-diethylaminoethyl acrylate (DEAEA); N,N-dimethylaminopropyl acrylate (DMAPA); N,N-diethylaminopropyl acrylate (DEAPA); N,N-dimethylaminoethyl methacrylate (DMAEMA); N,N-diethylaminoethyl methacrylate (DEAEMA); N,N-dimethylaminoethyl acrylamide (DMAEAm); N,N-dimethylaminoethyl methacrylamide (DMAEMAm); N,N-diethylaminoethyl acrylamide (DEAEAm); N,N-diethylaminoethyl methacrylamide (DEAEMAm); N,N-dimethylaminoethyl vinyl ether (DMAEVE); N,N-diethylaminoethyl vinyl ether (DEAEVE); and mixtures thereof. Other useful basic monomers include vinylpyridine, vinylimidazole, tertiary amino-functionalized styrene (e.g., 4-(N,N-dimethylamino)-styrene (DMAS), 4-(N,N-diethylamino)-styrene (DEAS)), N-vinylpyrrolidone, N-vinylcaprolactam, acrylonitrile, N-vinylformamide, (meth)acrylamide, and mixtures thereof.

When used to form the pressure sensitive adhesive matrix, acidic (meth)acrylate copolymers typically are derived from acidic monomers comprising about 2% by weight to about 30% by weight, or about 2% by weight to about 15% by weight, of a copolymerizable acidic monomer. Useful acidic monomers include, but are not limited to, those selected from ethylenically unsaturated carboxylic acids, ethylenically unsaturated sulfonic acids, ethylenically unsaturated phosphonic acids, and mixtures thereof. Examples of such compounds include those selected from acrylic acid, methacrylic acid, itaconic acid, fumaric acid, crotonic acid, citraconic acid, maleic acid, oleic acid, beta-carboxyethyl acrylate, 2-sulfoethyl methacrylate, styrenesulfonic acid, 2-acrylamido-2-methylpropanesulfonic acid, vinylphosphonic acid, and the like, and mixtures thereof. Due to their availability, typically ethylenically unsaturated carboxylic acids are used.

In certain embodiments, the poly(meth)acrylic pressure sensitive adhesive matrix is derived from between about 1 and about 20 weight percent of acrylic acid and between about 99 and about 80 weight percent of at least one of isooctyl acrylate, 2-ethylhexyl acrylate or n-butyl acrylate composition. In some embodiments, the pressure sensitive adhesive matrix is derived from between about 2 and about 10 weight percent acrylic acid and between about 90 and about 98 weight percent of at least one of isooctyl acrylate, 2-ethylhexyl acrylate or n-butyl acrylate composition.

Another useful class of optically clear (meth)acrylate-based pressure sensitive adhesives are those which are (meth)acrylic block copolymers. Such copolymers may contain only (meth)acrylate monomers or may contain other co-monomers such as styrenes. Examples of such pressure sensitive adhesives are described, for example in U.S. Pat. No. 7,255,920 (Everaerts et al.).

In embodiments where an adhesive layer is present, a release liner may be present to cover the adhesive layer. The release liner is removed prior to attachment of the adhesive layer to a substrate. A wide variety of release liners are suitable. Exemplary release liners include those prepared from paper (e.g., Kraft paper) or polymeric material (e.g., polyolefins such as polyethylene or polypropylene, ethylene vinyl acetate, polyurethanes, polyesters such as polyethylene terephthalate, and the like, and combinations thereof). At least some release liners are coated with a layer of a release agent such as a silicone-containing material or a fluorocarbon-containing material. Exemplary release liners include, but are not limited to, liners commercially available from CP Film (Martinsville, Va.) under the trade designation "T-30" and "T-10" that have a silicone release coating on polyethylene terephthalate film.

In some embodiments, the release liner is a microstructured release liner. Microstructured release liners are well-known in the adhesive arts. Typically, microstructured release liners are prepared by embossing a release liner with an embossable surface to a structured tool to impart a structured surface to the release liner. The microstructured release liner imparts a structured surface to the adhesive layer. This structured surface features are temporary features, meaning that the structures are designed to eventually disappear. There are numerous advantages to using adhesive articles with temporarily structured surfaces. Sometimes these adhesive articles are described as "laminating adhesive articles", since upon lamination the structures at least partially disappear. One such advantage of temporarily structured surfaces is air egress from the bond line. When an adhesive bond is formed, the adhesive surface is contacted to an adherend surface. When this contact is made, air can become trapped between the adhesive layer and the adherend surface, causing bubbles or other defects to form in the bond line, the line along which the two surfaces are joined together. This is particularly true when dealing with adherends that are rigid and semi-rigid substrates, but is also true when dealing with flexible substrates. This is particularly true with articles that are hand-laminated, as the lamination is subject to variability based upon operator experience and skill. These defects not only affect the adhesion of the adhesive layer to the adherend surface, but also affect the aesthetic appearance of the bond line and in the case of optical articles can ruin the formed article. In optical articles in which light travels through the adhesive layer, the presence of air bubbles and similar defects can greatly affect the optical properties such as light transmission, clarity, and haze and can make the bond line unacceptable, and can impact the viewing experience. To prevent these defects, a structured adhesive surface is often used. Generally, these structures are microstructures. During lamination, the microstructural features flatten out, thereby wetting the adherend surface, and forming a bond to the adherend surface. In the course of lamination, air bleeds out through the microstructural features to minimize or prevent the formation of bonding defects.

As mentioned above, the adhesive layer can be used to attach the articles of this disclosure to other surfaces including single layer articles and multilayer articles. Examples of single layer and multi-layer articles include films, rigid or semi-rigid substrates, multi-layer film constructions, or the surface of an electronic device. All of these types of constructions are described above.

Exemplary embodiments of articles of this disclosure are shown in the Figures. FIG. 1 shows a top view of an exemplary embodiment of articles of this disclosure. FIG. 1 shows article 100 comprising substrate 110 with an array of non-repeating geometric elements 120 that have been printed onto the surface of substrate 110. The non-repeating geometric elements 120 are shown as dots in the figure, but may have a variety of shapes.

Figure 2:
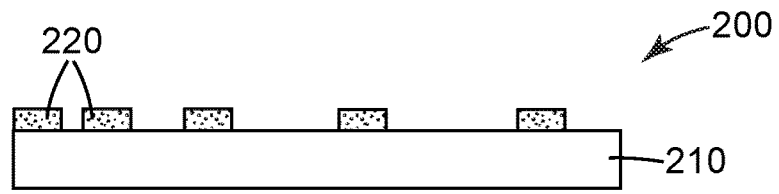
FIG. 2 shows a cross-sectional view of the exemplary embodiment of an article of this disclosure shown in FIG. 1.

FIG. 2 shows a cross-sectional view of the exemplary embodiment of an article of this disclosure shown in FIG. 1. FIG. 2 shows article 200 comprising substrate 210 with an array of non-repeating geometric elements 220 that have been printed onto the surface of substrate 210.

Figure 3:
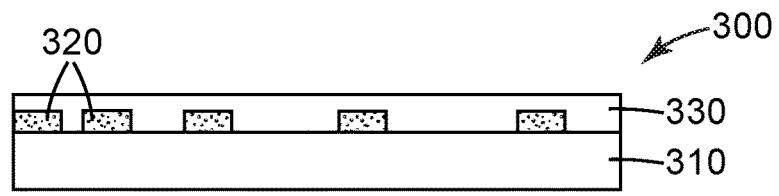
FIG. 3 shows a cross-sectional view of another exemplary embodiment of an article of this disclosure.

FIG. 3 shows a cross-sectional view of another exemplary embodiment of an article of this disclosure. FIG. 3 shows article 300 comprising substrate 310 with an array of non-repeating geometric elements 320 that have been printed onto the surface of substrate 310, similar to FIG. 2, and FIG. 3 further comprises coating 330 which covers the exposed substrate 310 and the non-repeating geometric elements 320. Coating 330 is shown completely covering the exposed substrate 310 and the non-repeating geometric elements 320, but embodiments in which coating 330 only partially covers the exposed substrate 310 and the non-repeating geometric elements 320 are also within the scope of this disclosure. Coating 330 may be a relatively thin coating such as a hardcoat, or it may be a relatively thick coating. While layer 330 is shown as a single layer, coating 330 can comprise a multi-layer coating or coating 330 can have additional layers attached to it to form a multi-layer construction.

Figure 4:
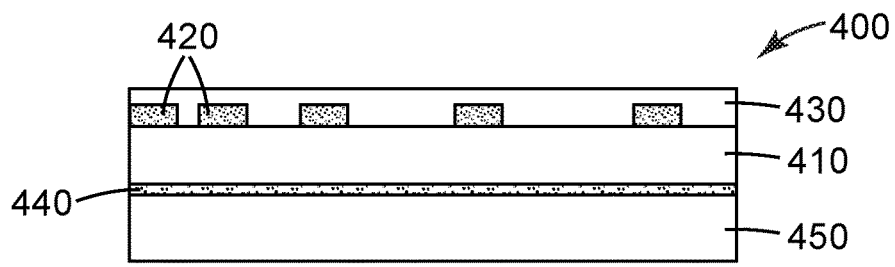
FIG. 4 shows a cross-sectional view of another exemplary embodiment of an article of this disclosure.

FIG. 4 shows a cross-sectional view of another exemplary embodiment of an article of this disclosure. FIG. 4 shows article 400 comprising substrate 410 with an array of non-repeating geometric elements 420 that have been printed onto the surface of substrate 410, similar to FIGS. 2 and 3, and FIG. 4, like FIG. 3, further comprises coating 430 which covers the exposed substrate 410 and the non-repeating geometric elements 420. Additionally, FIG. 4 includes layers 440 and 450. In some embodiments layer 440 comprises an adhesive layer. In these embodiments, layer 450 can comprise a release liner or layer 450 can comprise a single layer article or a multilayer article as described above.

This disclosure includes the following embodiments:

Among the embodiments are ink compositions. Embodiment 1 includes an ink composition comprising: a visible light transparent UV-curable binder composition; and a visible light transparent, and infrared light absorbing inorganic composition, wherein the ink composition is capable of flexographic printing at room temperature to a thickness of at least 1.0 micrometer, and wherein the cured ink composition has an infrared absorbance of at least 50%.

Embodiment 2 is the ink of embodiment 1, wherein the visible light transparent UV-curable binder composition comprises a (meth)acrylate-based composition comprising at least one tri-functional (meth)acrylate, at least one di-functional (meth)acrylate, or a combination thereof, and at least one UV-activatable initiator.

Embodiment 3 is the ink of embodiment 1 or 2, wherein the visible light transparent, and infrared light absorbing inorganic composition comprises nanoparticles of mixed metal oxides.

Embodiment 4 is the ink of any of embodiments 1-3, wherein the visible light transparent, and infrared light absorbing inorganic composition comprises nanoparticles of tungsten oxide, doped tungsten oxides, or mixed metal tungsten oxides.

Embodiment 5 is the ink of any of embodiments 1-4, wherein the visible light transparent, and infrared light absorbing inorganic composition comprises nanoparticles of cesium tungsten oxide.

Embodiment 6 is the ink of any of embodiments 1-5, wherein the ink composition has a viscosity at room temperature of from 400-15,000 centiPoise.

Embodiment 7 is the ink of any of embodiments 1-6, wherein the visible light transparent, and infrared light absorbing inorganic composition is present in a range of from 10.0-35.0% by weight of the total ink composition.

Embodiment 8 is the ink of any of embodiments 1-7, wherein the cured ink has an infrared absorbance of at least 75%.

Embodiment 9 is the ink of any of embodiments 1-8, wherein the ink composition is capable of flexographic printing at room temperature to pattern of geometric features, the features having an average diameter ranging from 50-200 micrometers.

Embodiment 10 is the ink of embodiment 9, wherein the pattern of geometric features comprising a random or non-random pattern of dots, or a series of parallel or intersecting lines.

Embodiment 11 is the ink of embodiment 10, wherein the pattern of geometric features comprises a non-repeating geometric pattern of dots.

Embodiment 12 is the ink of any of embodiments 9-11, wherein the geometric features have an average height above the surface of the substrate of from 1.0-5.0 micrometers.

Embodiment 13 is the ink of embodiment 12, wherein the geometric features comprise a non-repeating geometric pattern of dots.

Embodiment 14 is the ink of any of embodiments 1-13, wherein the portion of the surface of the second major surface of the substrate to which the ink composition is printed comprises a surface area, and the array of geometric features cover 5-20% of the surface area of the second major surface of the substrate.

Embodiment 15 is the ink of any of embodiments 1-14, wherein the ink composition is capable of flexographic printing at room temperature to a thickness of at least 1.0 micrometer in a single printing step.

Also disclosed are methods of preparing articles. Embodiment 16 includes a method of preparing an article comprising: providing a substrate with a first major surface and a second major surface; providing an ink composition, the ink composition comprising: a visible light transparent, UV-curable binder composition; and a visible light transparent, and infrared light absorbing inorganic composition, wherein the ink composition is capable of flexographic printing at room temperature to a thickness of at least 1.0 micrometer; flexographic printing the ink composition onto at least a portion of the second major surface of the substrate as a pattern of geometric features; and curing the UV-curable binder composition of the ink composition to form an array of geometric features on the second major surface of the substrate, wherein the ink composition after curing has an infrared absorbance of at least 50%.

Embodiment 17 is the method of embodiment 16, wherein the substrate comprises a film, a rigid or semi-rigid substrate, or the surface of an article.

Embodiment 18, is the method of embodiment 16 or 17, wherein the visible light transparent, UV-curable binder composition comprises a (meth)acrylate-based composition comprising at least one tri-functional (meth)acrylate, at least one di-functional (meth)acrylate, or a combination thereof and at least one UV-activatable initiator.

Embodiment 19 is the method of any of embodiments 16-18, wherein the visible light transparent, and infrared light absorbing inorganic composition comprises nanoparticles of mixed metal oxides.

Embodiment 20 is the method of any of embodiments 16-19, wherein the visible light transparent, and infrared light absorbing inorganic composition comprises nanoparticles of tungsten oxide, doped tungsten oxides, or mixed metal tungsten oxides.

Embodiment 21 is the method of any of embodiments 16-20, wherein the visible light transparent, and infrared light absorbing inorganic composition comprises nanoparticles of cesium tungsten oxide.

Embodiment 22 is the method of any of embodiments 16-21, wherein the ink composition has a viscosity at room temperature of from 400-15,000 centiPoise.

Embodiment 23 is the method of any of embodiments 16-22, wherein the visible light transparent, and infrared light absorbing inorganic composition is present in a range of from 10.0-35.0% by weight of the total ink composition.

Embodiment 24 is the method of any of embodiments 16-23, wherein the cured ink has an infrared absorbance of at least 75%.

Embodiment 25 is the method of any of embodiments 16-24, wherein the pattern of geometric features comprises a random or non-random pattern of dots, or a series of parallel or intersecting lines.

Embodiment 26 is the method of embodiment 25, wherein the pattern of geometric features comprises a random or non-random pattern of dots having an average diameter ranging from 50-200 micrometers.

Embodiment 27 is the method of embodiment 25 or 26, wherein the pattern of geometric features comprises a non-repeating geometric pattern.

Embodiment 28 is the method of any of embodiments 16-27, wherein the geometric features have an average height above the surface of the substrate of from 1.0-5.0 micrometers.

Embodiment 29 is the method of any of embodiments 16-28, wherein the portion of the surface of the second major surface of the substrate to which the ink composition is printed comprises a surface area, and the array of geometric features cover 5-20% of the surface area of the second major surface of the substrate.

Embodiment 30 is the method of any of embodiments 16-29, wherein printing the ink comprises a single printing step.

Also disclosed are articles. Embodiment 31 includes an article comprising: a substrate comprising a first major surface and a second major surface; and a non-repeating geometric pattern printed on at least a portion of the second major surface of the substrate, wherein the non-repeating geometric pattern comprises a series of geometric elements at least 1 micrometer in height, and wherein the geometric elements comprise a UV-cured ink composition, the ink composition comprising: a visible light transparent, UV-curable binder composition; and a visible light transparent, and infrared light absorbing inorganic composition.

Embodiment 32 is the article of embodiment 31, wherein the UV-cured ink composition has an infrared absorbance of at least 50%.

Embodiment 33 is the article of embodiment 31 or 32, wherein the substrate comprises a film, a rigid or semi-rigid substrate, or the surface of an article.

Embodiment 34 is the article of any of embodiments 31-33, wherein the substrate is transparent to visible and infrared light.

Embodiment 35 is the article of any of embodiments 31-33, wherein the substrate comprises an infrared light reflective substrate.

Embodiment 36 is the article of any of embodiments 31-35, further comprising a coating at least partially covering the non-repeating geometric pattern comprising a series of geometric elements.

Embodiment 37 is the article of embodiment 36, wherein the coating comprises a hardcoat.

Embodiment 38 is the article of embodiment 37, wherein the hardcoat further comprises an infrared absorbing composition.

Embodiment 39 is the article of any of embodiments 31-38, further comprising an adhesive layer at least partially covering the first major surface of the substrate.

Embodiment 40 is the article of embodiment 39, further comprising a single layer or multi-layer article in contact with and attached to the adhesive layer.

Embodiment 41 is the article of embodiment 40, wherein the single layer or multi-layer article comprises a film, a rigid substrate, a multi-layer film construction, or the surface of an electronic device.

EXAMPLES

Objects and advantages of this disclosure are further illustrated by the following examples, but the particular materials and amounts thereof recited in these examples, as well as other conditions and details, should not be construed to unduly limit this disclosure.

These examples are merely for illustrative purposes only and are not meant to be limiting on the scope of the appended claims.

All parts, percentages, ratios, etc. in the examples and the rest of the specification are by weight, unless noted otherwise. The reagents used were obtained from the specified sources and used as such without further purification unless otherwise noted.

Materials

Table of Abbreviations

| Abbreviation | Description |
| --- | --- |
| IR Absorb-1 | IR absorbing dispersion containing Cesium Tungsten oxide nanoparticles commercially available as "YMF-02A" from Sumitomo Metal and Mining Company, Japan. |
| HDDA | 1,6-Hexanedioldiacrylate, commercially available as "SR238" from Sartomer Company Inc. (Exton, PA) |
| PETA | Pentaerythritol tetraacrylate commercially available as "SR295" from Sartomer Company Inc. (Exton, PA) |
| DPPA | Dipentaerythritol pentaaacrylate commercially available as "SR399" from Sartomer Company Inc. (Exton, PA) |
| ETMPTA | 15 mole ethoxylated trimethylolpropane triacrylate commercially available as "SR9035" from Sartomer Company Inc. (Exton, PA) |
| PHGDA/PA | Propoxylated neopentyl glycol diacrylate/Phenoxyethyl acrylate commercially available as "SR9003B" from Sartomer Company Inc. (Exton, PA) |
| Inhibitor-1 | A radical inhibitor commercially available as "PROSTAB 5198" from BASF Corporation (Florham Park, NJ) |
| UA-1 | An aliphatic urethane acrylate commercially available as "EBECRYL 8602" from Allnex USA Inc. (Alpharetta, GA) |
| IBMA | Isobornyl methacrylate commercially available as "SR423A" from Sartomer Company Inc. (Exton, PA). |
| PI-1 | An alphahydroxyketone UV photoinitiator commercially available as "IRGACURE 184" from BASF Corporation (Florham Park, NJ) |
| UV Ink-1 | UV curable Flexographic clear ink commercially available as "UV Flexo Imprint NSV OPV" from Siegwork USA Company (Des Moines, IA). |
| UV Ink-2 | UV curable Flexographic clear ink commercially available as "UV OP1028 Premium Gloss HS OPV" from Nazdar Ink Technologies (Shawnee, KS) |
| White PET | 5 mil (127 micrometer) thick white film commercially available from Mitsubishi Chemicals, Japan |
| PET | Polyethylene terephthalate |

Flexographic Printing Using IR Absorbing UV Flexographic Ink

Flexographic printing was the method selected for the printing of the geometric patterns. Flexographic Printing (FP) is a well-known and understood process where an image, produced in a tooling plate or roll, is transferred in ink to a film or paper substrate.

1. An image was digitally transferred from a design file to a polymer flexographic tool via a laser engraving process, producing a very accurate tool with which to print continuous images on a web.
2. An Anilox roll consisting of various sized surface features, (volumes of the features are generally quoted as billionth of a cubic centimeter (bcm)), was mounted and placed in contact with an ink reservoir to be coated with ink. A doctor blade was then used to remove excess ink above the surface features of the Anilox roll.
3. The image tool was placed in contact with the Anilox roll where the specified volume of ink was transferred to the tooling features.
4. A PET web was threaded through a series of rollers and placed in contact with the tooling roll where one image was transferred to the PET with each revolution.
5. The image on the PET was passed through a UV cure station to cure the ink to the PET.

Additional layers of ink can be applied on top of the initial image, or around it, using additional tooling and automated registration capabilities at successive print stations along the press length. The cured roll of images was wound up at the end of the press.

A flexographic stamp composed of Anoto dot pattern (Anoto AB Lund, Sweden) was used for printing. For printing, stamps were made to print dot sizes of 60, 70, 80, 90 and 100 micrometers (μm). The flexographic stamps were manufactured by standard techniques and purchased from Lofton Labels, Inver Grove Heights, Minn., and used in conjunction with four different types 3.08, 3.82, 4.8 and 6.89 bcm Anilox rolls to print the UV Flexographic inks at various speeds using a desktop flexographic printer (Flexiproofer 100, RK PrintCoat Instruments, Royston, Cambridgeshire, UK) and a commercial UV flexographic printer on a White PET substrate which was corona treated. The printed patterns were UV cured by passing the coated substrate through a UV processor. After printing the dot patterns, portions or all of the pattern was over printed/coated with an additional layer using a UV Flexographic ink or coating solution.

UV Curing

For some UV Flexographic inks handspreads were coated on white PET using Meyer rods which were then UV cured on a UV processor fitted with an H-bulb (obtained from Fusion System Inc.) two times at speed of 40 feet per minute. After printing the geometric patterns, portions or all of the pattern was over printed/coated with the additional layer using additional UV Flexographic ink or coating solution.

Test Methods

Viscosity of the UV Flexographic Inks

Viscosity measurements were done using standard methods. The viscosities of the Flexographic inks were measured using a Brookfield viscometer.

Visible and IR Reflectance Measurement

The reflectance measurements were made on a Hunterlab UltraScan PRO spectrophotometer which meets CIE, ASTM and USP guidelines for accurate color measurement. The UltraScan PRO uses three Xenon flash lamps mounted in a reflective lamp housing as light source. The spectrophotometer was fitted with an integrating sphere accessory. This sphere was 152 mm (6 inches) in diameter and complies with ASTM methods E903, D1003, E308, et. al. as published in "ASTM Standards on Color and Appearance Measurements", Third Edition, ASTM, 1991. All samples printed and hardcoated on white PET film were measured for percent reflectance (Aperture 0.7 inches) with the unprinted side backed by two White PET sheets. The spectra was measured in the range 350-1050 nanometers (nm) with 5 nm optical resolution and reporting intervals. HunterLab's EasyMatch QC software was used in processing displaying, analyzing and reporting the spectral and color measurements. IR Reflectance at 850 nm was tabulated.

Measurement of the Geometric Patterns

The printed geometric features were analyzed by a confocal light microscope or an Infrared Camera. A geometric pattern consisting of Anoto dots were analyzed (for Dot Size, Dot shape, Pattern mean offset) using an Anoto Dot Analyzer (ADA) available from Anoto AB Lund, Sweden.

IR Absorber Concentration Determination

The approximate concentration of IR absorber was determined by calcining the ink sample containing the IR absorber, in a porcelain crucible at 700° C. for 2 hours and weighing the residual material.

EXAMPLES

Example 1

An Ink Concentrate was prepared by mixing 4050 grams of UV Ink-1 with 9200 grams of IR Absorb-1 in a round bottom flask. The flask was heated in a water bath at 50° C. and was attached to a rotary evaporator. Volatiles were removed under vacuum to prepare the UV Flexographic Ink Concentrate.

A sample of the UV Flexographic Ink Concentrate was further diluted with other acrylate resins for printing. The printing sample contained 1900 grams of UV Flexographic Ink Concentrate diluted to 4500 grams by adding 2600 grams of UV Ink-1. The ink concentrate had an IR absorber content of 25.4 wt % whereas the diluted ink had an IR absorber content of 15.4 wt %. The IR absorbing UV flexographic ink used for printing had a viscosity of 8387 centiPoise (cP) at 23° C. This ink was used for flexographic printing on White PET with various Anilox rolls. The printed sheets were UV cured and their geometric properties (size, shape and mean offset of dots) were measured using Anoto dot analyzer (ADA) and their optical properties were measured spectroscopically as shown in Tables 1 to 5.

Example 2

1000 grams of IR Absorb-1 was mixed with 1000 g HDDA in a round bottom flask. The flask was heated in a water bath at 50° C. and was attached to a rotary evaporator. Volatiles were removed under vacuum. 2 wt % PI-1 was added as a photo initiator to the mix based on the final weight of the concentrate. The final concentrate had an IR absorber concentration of 18.6 wt % and a viscosity of 466 cP at 23° C. This concentrate was mixed with other acrylates resins to create inks with different viscosities.

The inks were first characterized for IR absorber content, viscosity and were then either UV flexographically printed and/or handcoated on White PET using Meyer Rods. The printed or coated handspreads were UV cured and their geometric properties (size, shape and mean offset of dots) were measured using Anoto dot analyzer (ADA) and their optical properties were measured spectroscopically.

TABLE 1

Dot size (measured by ADA) with respect to Anilox volume

| Anilox (bcm) | Size of dots (Minimum) μm | Size of dots (Maximum) μm | Mean Size μm |
|---|---|---|---|
| 3.07 | 57 | 103 | 85 |
| 3.82 | 77 | 120 | 101 |
| 4.8 | 69 | 110 | 92 |
| 6.89 | 73 | 121 | 102 |

TABLE 2

Printed dot size versus the Target dot size (stamp)

| Target Dot Size μm | Min Size (μm) | Max Size (μm) | Mean Size (μm) |
|---|---|---|---|
| 60 | 57 | 81 | 71 |
| 70 | 72 | 93 | 85 |
| 80 | 87 | 108 | 98 |
| 90 | 97 | 118 | 107 |
| 100 | 100 | 121 | 112 |

TABLE 3

Dot Shape (Circularity) with respect to target size and Anilox volume

| | 3.07 bcm | 3.82 bcm | 4.8 bcm | 6.89 bcm |
|---|---|---|---|---|
| 60 μm | 1.26 | 1.18 | 1.18 | 1.17 |
| 70 μm | 1.22 | 1.18 | 1.16 | 1.17 |
| 80 μm | 1.21 | 1.14 | 1.14 | 1.11 |
| 90 μm | 1.18 | 1.13 | 1.12 | 1.16 |
| 100 μm | 1.16 | 1.12 | 1.12 | 1.12 |

TABLE 4

Dot Mean Offset (μm) with respect to target size and Anilox volume

| | 3.07 bcm | 3.82 bcm | 4.8 bcm | 6.89 bcm |
|---|---|---|---|---|
| 60 μm | 40.6 | 40.2 | 40.6 | 40.8 |
| 70 μm | 41.6 | 41.9 | 41.1 | 41.9 |
| 80 μm | 42.7 | 42.8 | 42.5 | 43.0 |
| 90 μm | 42.5 | 42.9 | 42.5 | 43.0 |
| 100 μm | 42.5 | 42.9 | 43.0 | 43.5 |

TABLE 5

Percent IR Reflectance (measured at 850 nm) of the printed dots and solid patch (handspread) for different stamps (target dot size) and Anilox volumes with and without IR topcoat

| | 3.07 bcm | | 3.82 bcm | | 4.8 bcm | | 6.89 bcm | |
|---|---|---|---|---|---|---|---|---|
| | No Top Coat | With IR top coat | No Top Coat | With IR Top coat | No Top coat | With IR top coat | No Top coat | With IR top coat |
| 60 μm | 90.8 | 55.2 | 88.2 | 68.3 | 89.1 | 62.8 | 85.7 | 73.0 |
| 70 μm | 88.8 | 55.5 | 85.4 | 53.5 | 87.4 | 52.6 | 88.3 | 49.7 |
| 80 μm | 87.5 | 55.7 | 84.5 | 58.9 | 84.7 | 76.7 | 81.9 | 64.5 |
| 90 μm | 86.2 | 54.9 | 82.6 | 49.7 | 82.5 | 54.5 | 79.5 | 49.7 |
| 100 μm | 85.5 | 58.7 | 81.9 | 62.6 | 81.9 | 52.2 | 78.5 | 57.8 |
| Solid Patch | 31.8 | 28.3 | 24.8 | 21.6 | 23.7 | 20.4 | 20.1 | 18.3 |

What is claimed is:

1. An ink composition comprising:
    a visible light transparent, UV-curable binder composition; and
    a visible light transparent, and infrared light absorbing inorganic composition, wherein the visible light transparent and infrared light absorbing inorganic composition comprises nanoparticles of tungsten oxide, doped tungsten oxide, or cesium tungsten oxide;
    wherein the ink composition is 100% solids and capable of flexographic printing at room temperature to a thickness of at least 1.0 micrometer, and wherein the cured ink composition has an infrared absorbance of at least 50%.

2. The ink of claim 1, wherein the visible light transparent UV-curable binder composition comprises a (meth)acrylate-based composition comprising at least one tri-functional (meth)acrylate, at least one di-functional (meth)acrylate, or a combination thereof, and at least one UV-activatable initiator.

3. The ink of claim 1, wherein the ink composition has a viscosity at room temperature of from 400-15,000 centiPoise.

4. The ink of claim 1, wherein the visible light transparent, and infrared light absorbing inorganic composition is present in a range of from 10.0-35.0% by weight of the total ink composition.

5. The ink of claim 1, wherein the cured ink has an infrared absorbance of at least 75%.

6. The ink of claim 1, wherein the ink composition is capable of flexographic printing at room temperature to a pattern of geometric features, the geometric features having an average diameter ranging from 50-200 micrometers.

7. A method of preparing an article comprising:
    providing a substrate with a first major surface and a second major surface;
    providing a 100% solids ink composition, the ink composition comprising:
        a visible light transparent UV-curable binder composition; and
        a visible light transparent, and infrared light absorbing inorganic composition, wherein the visible light transparent and infrared light absorbing inorganic composition comprises nanoparticles of tungsten oxide, doped tungsten oxide, or cesium tungsten oxide;
    wherein the ink composition is capable of flexographic printing at room temperature to a thickness of at least 1.0 micrometer;

flexographic printing the ink composition onto at least a portion of the second major surface of the substrate as a pattern of geometric features; and curing the UV-curable binder composition of the ink composition to form an array of geometric features on the second major surface of the substrate, wherein the ink composition after curing has an infrared absorbance of at least 50%.

8. The method of claim 7, wherein the substrate comprises a film, a rigid or semi-rigid substrate, or the surface of an article.

9. The method of claim 7, wherein the visible light transparent UV-curable binder composition comprises a (meth)acrylate-based composition comprising at least one tri-functional (meth)acrylate, at least one di-functional (meth)acrylate, or a combination thereof and at least one UV-activatable initiator.

10. The method of claim 7, wherein the visible light transparent, and infrared light absorbing inorganic composition comprises nanoparticles of mixed metal oxides.

11. The method of claim 7, wherein the ink composition has a viscosity at room temperature of from 400-15,000 centiPoise.

12. The method of claim 7, wherein the pattern of geometric features comprises a random or non-random pattern of dots, or a series of parallel or intersecting lines.

13. The method of claim 12, wherein the pattern of geometric features comprises a non-repeating geometric pattern.

14. An article comprising:
a substrate comprising a first major surface and a second major surface; and
a non-repeating geometric pattern printed on at least a portion of the second major surface of the substrate, wherein the non-repeating geometric pattern comprises a series of geometric elements at least 1 micrometer in height, and wherein the geometric elements comprise a UV-cured ink composition, the ink composition comprising:
a visible light transparent UV-curable binder composition; and
a visible light transparent, and infrared light absorbing inorganic composition, wherein the visible light transparent and infrared light absorbing inorganic composition comprises nanoparticles of tungsten oxide, doped tungsten oxide, or cesium tungsten oxide;
wherein the ink composition is a 100% solids composition.

15. The article of claim 14, wherein the substrate is transparent to visible and infrared light.

16. The article of claim 14, wherein the substrate comprises an infrared light reflective substrate.

17. The article of claim 14, further comprising a coating at least partially covering the non-repeating geometric pattern comprising a series of geometric elements.

18. The article of claim 14, further comprising an adhesive layer at least partially covering the first major surface of the substrate.

19. The article of claim 18, further comprising a single layer or multi-layer article in contact with and attached to the adhesive layer.

* * * * *